(12) United States Patent
Lin

(10) Patent No.: US 6,436,734 B1
(45) Date of Patent: *Aug. 20, 2002

(54) METHOD OF MAKING A SUPPORT CIRCUIT FOR A SEMICONDUCTOR CHIP ASSEMBLY

(76) Inventor: Charles W. C. Lin, 34 Pinewood Grove, Singapore (SG), 738290

( * ) Notice: Subject to any disclaimer, the term of this patent is extended or adjusted under 35 U.S.C. 154(b) by 0 days.

This patent is subject to a terminal disclaimer.

(21) Appl. No.: 09/878,521

(22) Filed: Jun. 11, 2001

Related U.S. Application Data

(63) Continuation-in-part of application No. 09/643,213, filed on Aug. 22, 2000.

(51) Int. Cl.[7] .......................... H01L 21/44; H01L 21/48; H01L 21/50
(52) U.S. Cl. ...................... 438/121; 438/107; 438/108; 438/123
(58) Field of Search ................... 438/618, 106–112, 438/121, 123

(56) References Cited

U.S. PATENT DOCUMENTS

| | | | |
|---|---|---|---|
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,074,947 A | 12/1991 | Estes et al. | 156/307.3 |
| 5,106,461 A | 4/1992 | Volfson et al. | 205/125 |
| 5,116,459 A | 5/1992 | Kordus et al. | 156/631 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |

(List continued on next page.)

FOREIGN PATENT DOCUMENTS

| | | | |
|---|---|---|---|
| EP | 0 718 882 A1 | 6/1996 | H01L/23/057 |
| WO | WO 97/38563 | 10/1997 | H05K/1/03 |
| WO | WO 99/57762 | 11/1999 | H01L/23/48 |

OTHER PUBLICATIONS

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0–7803–4526–6/98, Jun. 1998, 5 pages.

(List continued on next page.)

*Primary Examiner*—Jey Tsai
(74) *Attorney, Agent, or Firm*—David M. Sigmond

(57) ABSTRACT

A method of manufacturing a support circuit includes providing a conductive layer with top and bottom surfaces,, providing a top etch mask on the top surface that includes an opening that exposes a portion of the top surface, providing a bottom etch mask on the bottom surface that includes an opening that exposes a portion of the bottom surface, applying an etch to the exposed portion of the top surface through the opening in the top etch mask, thereby etching partially but not completely through the conductive layer and forming a recessed portion in the conductive layer below the top surface, forming an insulative base on the recessed portion without forming the insulative base on the top surface, and applying an etch to the exposed portion of the bottom surface through the opening in the bottom etch mask, thereby forming a routing line in the recessed portion that extends to and is covered by the insulative base.

50 Claims, 12 Drawing Sheets

U.S. PATENT DOCUMENTS

| | | | | |
|---|---|---|---|---|
| 5,355,283 A | 10/1994 | Marrs et al. | ............... | 361/760 |
| 5,358,621 A | 10/1994 | Oyama | ............... | 205/123 |
| 5,397,921 A | 3/1995 | Karnezos | ............... | 257/779 |
| 5,407,864 A | 4/1995 | Kim | ............... | 437/203 |
| 5,424,245 A | 6/1995 | Gurtler et al. | ............... | 437/183 |
| 5,438,477 A | 8/1995 | Pasch | ............... | 361/689 |
| 5,439,162 A | 8/1995 | George et al. | ............... | 228/180.22 |
| 5,447,886 A | 9/1995 | Rai | ............... | 437/183 |
| 5,454,161 A | 10/1995 | Beilin et al. | ............... | 29/852 |
| 5,454,928 A | 10/1995 | Rogers et al. | ............... | 205/125 |
| 5,475,236 A | 12/1995 | Yoshizaki | ............... | 257/48 |
| 5,477,933 A | 12/1995 | Nguyen | ............... | 174/262 |
| 5,478,007 A | 12/1995 | Marrs | ............... | 228/180.22 |
| 5,483,421 A | 1/1996 | Gedney et al. | ............... | 361/771 |
| 5,484,647 A | 1/1996 | Nakatani et al. | ............... | 428/209 |
| 5,487,218 A | 1/1996 | Bhatt et al. | ............... | 29/852 |
| 5,489,804 A | 2/1996 | Pasch | ............... | 257/778 |
| 5,493,096 A | 2/1996 | Koh | ............... | 219/121.71 |
| 5,508,229 A | 4/1996 | Baker | ............... | 437/183 |
| 5,525,065 A | 6/1996 | Sobhani | ............... | 439/67 |
| 5,536,973 A | 7/1996 | Yamaji | ............... | 257/737 |
| 5,542,601 A | 8/1996 | Fallon et al. | ............... | 228/119 |
| 5,547,740 A | 8/1996 | Higdon et al. | ............... | 428/209 |
| 5,556,810 A | 9/1996 | Fujitsu | ............... | 437/209 |
| 5,556,814 A | 9/1996 | Inoue et al. | ............... | 437/230 |
| 5,564,181 A | 10/1996 | Dineen et al. | ............... | 29/841 |
| 5,572,069 A | 11/1996 | Schneider | ............... | 257/690 |
| 5,576,052 A | 11/1996 | Arledge et al. | ............... | 427/98 |
| 5,583,073 A | 12/1996 | Lin et al. | ............... | 439/183 |
| 5,595,943 A | 1/1997 | Itabashi et al. | ............... | 437/230 |
| 5,599,744 A | 2/1997 | Koh et al. | ............... | 437/195 |
| 5,611,140 A | 3/1997 | Kulesza et al. | ............... | 29/832 |
| 5,611,884 A | 3/1997 | Bearinger et al. | ............... | 156/325 |
| 5,613,296 A | 3/1997 | Kurino et al. | ............... | 29/852 |
| 5,614,114 A | 3/1997 | Owen | ............... | 219/121.66 |
| 5,615,477 A | 4/1997 | Sweitzer | ............... | 29/840 |
| 5,619,791 A | 4/1997 | Lambrecht, Jr. et al. | ...... | 29/852 |
| 5,627,405 A | 5/1997 | Chillara | ............... | 257/668 |
| 5,627,406 A | 5/1997 | Pace | ............... | 257/700 |
| 5,633,204 A | 5/1997 | Tago et al. | ............... | 438/614 |
| 5,637,920 A | 6/1997 | Loo | ............... | 257/700 |
| 5,641,113 A | 6/1997 | Somaki et al. | ............... | 228/180.22 |
| 5,645,628 A | 7/1997 | Endo et al. | ............... | 106/1.23 |
| 5,646,067 A | 7/1997 | Gaul | ............... | 437/180 |
| 5,648,686 A | 7/1997 | Hirano et al. | ............... | 257/778 |
| 5,654,584 A | 8/1997 | Fujitsu | ............... | 257/666 |
| 5,656,858 A | 8/1997 | Kondo et al. | ............... | 257/737 |
| 5,663,598 A | 9/1997 | Lake et al. | ............... | 257/737 |
| 5,665,652 A | 9/1997 | Shimizu | ............... | 438/127 |
| 5,666,008 A | 9/1997 | Tomita et al. | ............... | 257/778 |
| 5,669,545 A | 9/1997 | Pham et al. | ............... | 228/1.1 |
| 5,674,785 A | 10/1997 | Akram et al. | ............... | 437/217 |
| 5,674,787 A | 10/1997 | Zhao et al. | ............... | 437/230 |
| 5,682,061 A | 10/1997 | Khandros et al. | ............... | 257/666 |
| 5,691,041 A | 11/1997 | Frankeny et al. | ............... | 428/209 |
| 5,722,162 A | 3/1998 | Chou et al. | ............... | 29/852 |
| 5,723,369 A | 3/1998 | Barber | ............... | 438/106 |
| 5,731,223 A | 3/1998 | Padmanabhan | ............... | 437/183 |
| 5,736,456 A | 4/1998 | Akram | ............... | 438/614 |
| 5,739,585 A | 4/1998 | Akram et al. | ............... | 257/698 |
| 5,744,859 A | 4/1998 | Ouchida | ............... | 257/668 |
| 5,757,071 A | 5/1998 | Bhansali | ............... | 257/697 |
| 5,757,081 A | 5/1998 | Chang et al. | ............... | 257/781 |
| 5,764,486 A | 6/1998 | Pendse | ............... | 361/774 |
| 5,774,340 A | 6/1998 | Chang et al. | ............... | 361/771 |
| 5,789,271 A | 8/1998 | Akram | ............... | 438/18 |
| 5,798,285 A | 8/1998 | Bentlage et al. | ............... | 438/108 |
| 5,801,072 A | 9/1998 | Barber | ............... | 438/107 |
| 5,801,447 A | 9/1998 | Hirano et al. | ............... | 257/778 |
| 5,803,340 A | 9/1998 | Yeh et al. | ............... | 228/56.3 |
| 5,804,771 A | 9/1998 | McMahon et al. | ............... | 174/255 |
| 5,808,360 A | 9/1998 | Akram | ............... | 257/738 |
| 5,811,879 A | 9/1998 | Akram | ............... | 257/723 |
| 5,817,541 A | 10/1998 | Averkiou et al. | ............... | 438/107 |
| 5,822,856 A | 10/1998 | Bhatt et al. | ............... | 29/832 |
| 5,834,844 A | 11/1998 | Akagawa et al. | ............... | 257/734 |
| 5,861,666 A | 1/1999 | Bellaar | ............... | 257/686 |
| 5,863,816 A | 1/1999 | Cho | ............... | 438/123 |
| 5,870,289 A | 2/1999 | Tokuda et al. | ............... | 361/779 |
| 5,883,435 A | 3/1999 | Geffken et al. | ............... | 257/758 |
| 5,925,931 A | 7/1999 | Yamamoto | ............... | 257/737 |
| 5,994,222 A | 11/1999 | Smith et al. | ............... | 438/689 |
| 6,012,224 A | 1/2000 | DiStefano et al. | ............... | 29/840 |
| 6,013,877 A | 1/2000 | Degani et al. | ............... | 174/264 |
| 6,018,196 A | 1/2000 | Noddin | ............... | 257/777 |
| 6,020,561 A | 2/2000 | Ishida et al. | ............... | 174/261 |
| 6,037,665 A | 3/2000 | Miyazaki | ............... | 257/773 |
| 6,046,909 A | 4/2000 | Joy | ............... | 361/748 |
| 6,084,297 A | 6/2000 | Brooks et al. | ............... | 257/698 |
| 6,084,781 A | 7/2000 | Klein | ............... | 361/771 |
| 6,103,552 A | 8/2000 | Lin | ............... | 438/113 |
| 6,103,992 A | 8/2000 | Noddin | ............... | 219/121.71 |
| 6,127,204 A | 10/2000 | Isaacs et al. | ............... | 438/106 |
| 6,350,386 B1 * | 2/2002 | Lin | ............... | 205/125 |

OTHER PUBLICATIONS

Ghaffarian, "Long Time BGA Assembly Reliability," Advancing Microelectronics, vol. 25, No. 6, Sep./Oct. 1998, pp. 20–23.

U.S. application Ser. No. 09/465,024, filed Dec. 16, 1999, entitled "Bumpless Flip Chip Assembly With Solder Via".

U.S. application Ser. No. 09/464,562, filed Dec. 16, 1999, entitled "Bumpless Flip Chip Assembly With Strips And Via–Fill".

U.S. application Ser. No. 09/464,561, filed Dec. 16, 1999, entitled "Bumpless Flip Chip Assembly With Strips–In–Via And Plating".

Markstein et al., "Controlling the Variables in Stencil Printing," Electronic Packaging & Production, Feb. 1997, pp. 48–56.

Elenius, "Choosing a Flip Chip Bumping Supplier–Technology an IC Package contractor should look for," Advanced Packaging, Mar./Apr. 1998, pp. 70–73.

U.S. application Ser. No. 09/120,408, filed Jul. 22, 1998, entitled "Flip Chip Assembly with Via Interconnection".

U.S. application Ser. No. 09/643,212, filed Aug. 22, 2000, entitled "Semiconductor Chip Assembly With Simultaneously Electroplated Contact Terminal and Connection Joint".

U.S. application Ser. No. 09/643,214, filed Aug. 22, 2000, entitled "Semiconductor Chip Assembly with Simultaneously Electrolessly Plated Contact Terminal and Connection Joint".

U.S. application Ser. No. 09/643,445, filed Aug. 22, 2000, entitled "Method Of Making A Semiconductor Chip Assembly".

* cited by examiner

METHOD OF MAKING A SUPPORT CIRCUIT FOR A SEMICONDUCTOR CHIP ASSEMBLY

CROSS-REFERENCE TO RELATED APPLICATIONS

This application is a continuation-in-part of U.S. application Ser. No. 09/643,213 filed Aug. 22, 2000, which is incorporated by reference.

BACKGROUND OF THE INVENTION

1. Field of the Invention

The present invention relates generally to electrical substrates, and more particularly to a support circuit that can be connected to a semiconductor chip to provide a semiconductor chip assembly.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding. Wire bonding is by far the most common. In this approach, wires are bonded, one at a time, from the chip to external circuitry by ultrasonic, thermocompression or thermosonic processes. TAB involves bonding. gold-bumped pads on the chip to external circuitry on a polymer tape using thermocompression bonding. Both wire bonding and TAB require mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

Other techniques besides wire bonding, TAB and flip-chip bonding have been developed to connect chips to external circuitry without using wires, leads or bumps. Such techniques include thin film rerouting at the wafer, panel or module level, and attaching a pre-patterned substrate to the chip such that through-holes in the substrate expose the pads and selectively applying conductive material into the through-holes. Several approaches are described below.

A typical thin film routing approach includes depositing a dielectric material on the chip, providing through-holes in the dielectric material that expose the pads, providing metallization in the through-holes that contacts the pads, and providing a top layer of conductive circuitry on the dielectric material that contacts the metallization. In this manner, the additional circuitry is fabricated on the chip. Drawbacks to this approach include complicated manufacturing requirements, high cost, and chip loss if the additional circuitry is defective. In particular, since the chip or wafer provides a substrate for the additional circuitry, chips will be lost if the additional circuitry fails to achieve certain quality and yield criteria. Unpredictable chip loss has prevented the wide spread adoption of this "chip first" approach in volume production. Furthermore, if the process is not performed on wafers, the commercially available silicon wafer processing equipment may not be. compatible with common tooling and handling techniques.

U.S. Pat. No. 5,407,864 discloses providing a partially assembled printed circuit board (PCB) with buried conductive traces and through-holes that expose portions of the conductive traces, attaching the PCB to the chip using an adhesive, removing portions of the adhesive exposed by the through-holes to expose the pads, depositing a blanket conductive layer over the PCB which covers the pads and sidewalls of the through-holes without filling the through-holes, depositing a blanket insulative layer over the PCB which fills the remaining space in the through-holes, polishing the PCB to remove the conductive layer and the insulative layer from the top surface, and providing circuitry at the top surface that is connected to the conductive traces. In this manner, the circuitry at the top surface is connected to the pads through the conductive traces and portions of the conductive layer in the through-holes. Since, however, the conductive layer is blanket deposited over the entire PCB, polishing is used to remove the conductive layer from the top surface of the PCB. since it would otherwise short the pads together. Polishing the conductive layer is costly and time consuming. Another drawback is that the polishing completely removes the top layer of the PCB, and therefore subsequent processes such as masking, circuitization and bumping are necessary for fabricating top surface circuitry such as traces and terminals for the next level assembly.

U.S. Pat. No. 6,037,665 discloses providing a chip with solder bumped pads, providing a pre-patterned multi-layer substrate with pre-metallized through-holes aligned with the pads, filling solder from the bumped pads into the through-holes, and reflowing the solder to form solder joint connections with the pads. This approach is similar to flip-chip bonding except that the solder is filled into the through-holes instead of merely being disposed between the chip and the substrate.

Drawbacks to this approach include the need to solder bump the chip as well as the disadvantages of solder joints discussed above.

U.S. Pat. No. 5,116,463 discloses attaching a multi-layer substrate to a chip that includes forming through-holes through a dielectric layer that extend to the pads and electrolessly plating metal into the through-holes. The electroless plating is initiated by the pads and continues until the deposited metal fills the through-holes and contacts metallization on the top surface of the substrate. Drawbacks to this approach include the need for the metallization on the top surface to provide endpoint detection and the possibility that electroless plating on the metallization on the top surface adjacent to the top of the through-hole may close the through-hole before the electroless plating fills the through-hole.

U.S. Pat. No. 5,556,810 discloses inner leads laminated by an organic film and attached to a chip by an adhesive. Distal ends of the inner leads are positioned near the pads and then electrically connected to the pads by L-shaped plated metal. However, since the inner leads are flexible and vary in height and length, the inner leads may not be positioned precisely and uniformly, the gaps between the distal ends and the respective pads can vary, and consequently the electrolessly plated joints may be weak or open. Furthermore, if the chip has moderate to high pad density and a separate power/ground plane is needed to achieve better electrical performance, the single layer inner leads may not be suitable. In addition, handling of this leaded-chip for the next level assembly such as outer lead bonding or board level assembly can be problematic since the leads are soft and easily bent, rendering it difficult to maintain co-planarity among the leads during the next level assembly.

Recent introduction of grid array packaging (e.g., ball grid arrays), chip size packages (CSP) and flip-chip packages using high density interconnect substrates are relentlessly driving increased printed circuit board density. Shrinking traces and spaces and increasing layer count increase printed circuit board density, however reducing the size of plated through-holes can even more significantly increase printed circuit board density. Small through-holes allow more routing space so that more conductive lines can be placed between the through-holes. Small through-holes also increase design flexibility and reduce design cycle time and overall product introduction time.

Conventional printed circuit boards have drilled through-holes with a size (diameter) in the range of 200 to 400 microns. As drilling technology improves, the drilled through-hole size is anticipated to reach 100 microns. Moreover, recently developed methods for forming through-holes using a punch, plasma or laser have driven down through-hole size to the range of 50 microns or less. A typical chip pad has a length and width on the order of 50 to 100 microns. Since the through-holes allow the pads to interconnect with various circuitry layers, using through-holes with similar sizes to the pads is desirable. The major advantage of using metallization in through-holes to interconnect the pads is that it replaces external media such as wires, bumps and leads.

The semiconductor chip assembly is subsequently connected to another circuit such as a PCB or mother board during next level assembly. Different semiconductor assemblies are connected to the next level assembly in[] different ways. For instance, ball grid array (BGA) packages contain an array of solder balls, and land grid array (LGA) packages contain an array of metal pads that receive corresponding solder traces on the PCB. However, since BGA and LGA packages are connected to the PCB by solder joints, the compliance is small and solder joint reliability problems exist. Plastic quad flat pack (PQFP) packages have a lead frame formed into a gull-wing shape. When the PQFP is assembled on a PCB, this full-wing lead serves as the contact terminal which provides compliance and reduces stress on the solder joints. However, drawbacks to PQFP packages include the large size of the lead and poor high frequency electrical characteristics.

Thermo-mechanical wear or creep of the solder joints that connect the semiconductor chip assembly to the next level assembly is a major cause of failure in most board assemblies. This is because non-uniform thermal expansion and/or contraction of different materials causes mechanical stress on the solder joints.

Thermal mismatch induced solder joint stress can be reduced by using materials having a similar coefficient of thermal expansion (CTE). However, due to large transient temperature differences between the chip and other materials during power-up of the system, the induced solder joint stress makes the assembly unreliable even when the chip and the other materials have closely matched thermal expansion coefficients.

Thermal mismatch induced solder joint stress can also be reduced by proper design of the support circuit. For instance, BGA and LGA packages have been designed with pillar post type contact terminals that extend above the package and act as a stand-off or spacer between the package and the PCB in order to absorb thermal stress and reduce solder joint fatigue. The higher the aspect ratio of the pillar, the more easily the pillar can flex to follow expansion of the two ends and reduce shear stress.

Conventional approaches to forming the pillar either on a wafer or a separate support circuit include a bonded interconnect process (BIP) and plating using photoresist.

BIP forms a gold ball on a pad of the chip and a gold pin extending upwardly from the gold ball using a thermocompression wire bonder. Thereafter, the gold pin is brought in contact with a molten solder bump on a support circuit, and the solder is reflowed and cooled to form a solder joint around the gold pin. A drawback to this approach is that when the wire bonder forms the gold ball on the pad it applies substantial pressure to the pad which might destroy active circuitry beneath the pad. In addition, gold from the pin can dissolve into the solder to form a gold-tin intermetallic compound which mechanically weakens the pin and therefore reduces reliability.

U.S. Pat. No. 5,722,162 discloses fabricating a pillar by electroplating the pillar on a selected portion of an underlying metal exposed by an opening in photoresist and then stripping the photoresist. Although it is convenient to use photoresist to define the location of the pillar, electroplating the pillar in an opening in the photoresist has certain drawbacks. First, the photoresist is selectively exposed to light that initiates a reaction in regions of the photoresist that correspond to the desired pattern. Since photoresist is not fully transparent and tends to absorb the light, the thicker the photoresist, the poorer the penetration efficiency of the light. As a result, the lower portion of the photoresist might not receive adequate light to initiate or complete the intended photo-reaction. Consequently, the bottom portion of the opening in the photoresist might be too narrow, causing a pillar formed in the narrowed opening to have a diameter that decreases with decreasing height. Such a pillar has a high risk of fracturing at its lower portion in response to thermally induced stress. Second, if the photoresist is relatively thick (such as 100 microns or more), the photoresist may need to be applied with multiple coatings and receive multiple light exposures and bakes, which increases cost and reduces yield. Third, if the photoresist is relatively thick, the electroplated pillar may be non-uniform due to poor current density distribution in the relatively deep opening. As a result, the pillar may have a jagged or pointed top surface instead of a flat top surface that is better suited for providing a contact terminal for the next level assembly.

In view of the various development stages and limitations in currently available support circuits for semiconductor chip assemblies, there is a need for a support circuit that is cost-effective, reliable, manufacturable, provides excellent mechanical and electrical performance, and complies with stringent environmental standards.

SUMMARY OF THE INVENTION

An object of the present invention is to provide a support circuit adapted for semiconductor chip assemblies such as chip scale packages, chip size packages, ball grid arrays or other structures.

Another object of the present invention is to provide a convenient, cost-effective method for manufacturing a support circuit for use in a low cost, high performance, high reliability package.

In accordance with one aspect of the invention, a method of manufacturing a support circuit includes providing a conductive layer with top and bottom surfaces, providing a top etch mask on the top surface that includes an opening that exposes a portion of the top surface, providing a bottom etch mask on the bottom surface that includes an opening that exposes a portion of the bottom surface, applying an etch to the exposed portion of the top surface through the opening in the top etch mask, thereby etching partially but not completely through the conductive layer and forming a recessed portion in the conductive layer below the top surface, forming an insulative base on the recessed portion without forming the insulative base on the top surface, and applying an etch to the exposed portion of the bottom; surface through the opening in the bottom etch mask, thereby forming a routing line in the recessed portion that extends to and is covered by the insulative base.

Preferably, applying the etch to the exposed portion of the top surface forms a pillar in the conductive layer. It is also preferred that the pillar extends above the routing line at least twice the distance that the insulative base extends above the routing line, and that the pillar is tapered such that the diameter of the pillar decreases as the height of the pillar increases.

The method may include simultaneously forming the etch masks during an electroplating operation, and simultaneously stripping the etch masks after applying the etchs.

The method may also include applying an etch to the insulative base through an etch mask over the top surface to form an opening in the insulative base that exposes the routing line.

The method may further include covering the bottom surface with an adhesive such as an uncured epoxy that contacts and is contained by the insulative base.

An advantage of the present invention is that the pillar is formed using etching (i.e., subtractively) rather than by electroplating or electroless plating (i.e., additively) which improves uniformity and reduces manufacturing time and cost. Another advantage is that the support circuit can be manufactured using low temperature processes which reduces stress and improves reliability. A further advantage is that the support circuit can be manufactured using well-controlled wet chemical processes which can be easily implemented by circuit board, lead frame and tape manufacturers. Still another advantage is that the support circuit can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

FIGS. 1A–1K, 2A–2K and 3A–3K are cross-sectional, top and bottom views, respectively, of a method of manufacturing a support circuit in accordance with an embodiment of the present invention.

Figure 1A:
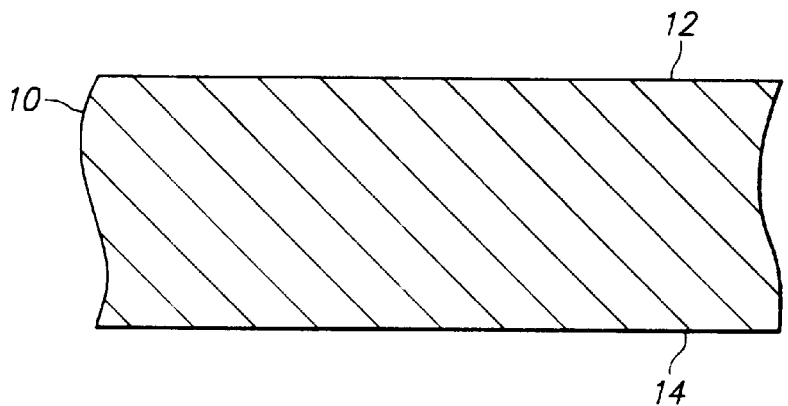
FIGS. 1A–1K are cross-sectional views showing a method of manufacturing a support circuit in accordance with an embodiment of the present invention.
Figure 2A:
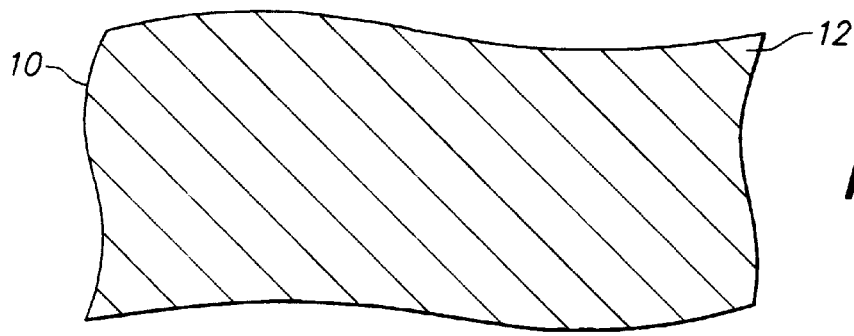
FIGS. 2A–2K are top plan views corresponding to FIGS. 1A–1K, respectively.
Figure 3A:
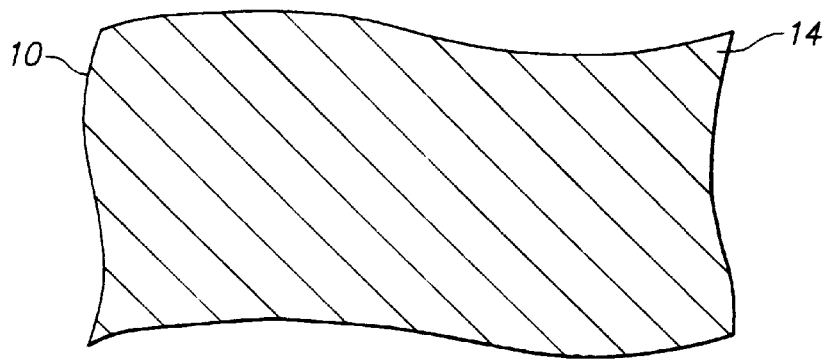
FIGS. 3A–3K are bottom plan views corresponding to FIGS. 1A–1K, respectively.

FIGS. 1A, 2A and 3A are cross-sectional, top and bottom views, respectively, of copper foil 10 which includes top surface 12 and bottom surface 14. Copper foil has a thickness of 150 microns.

Figure 1B:
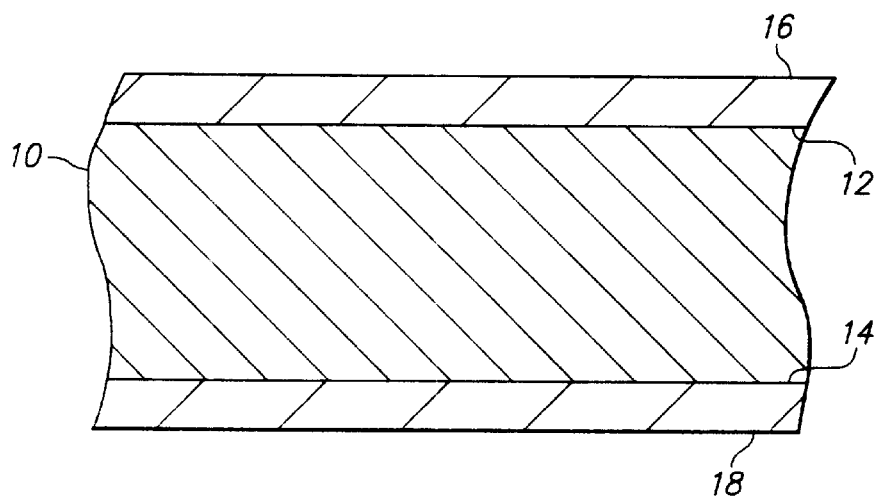
Figure 2B:
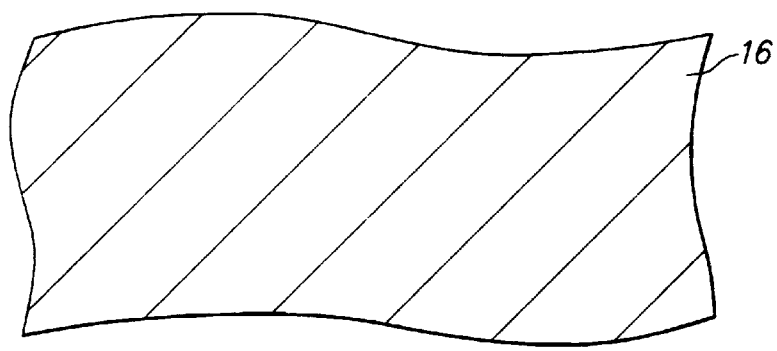
Figure 3B:
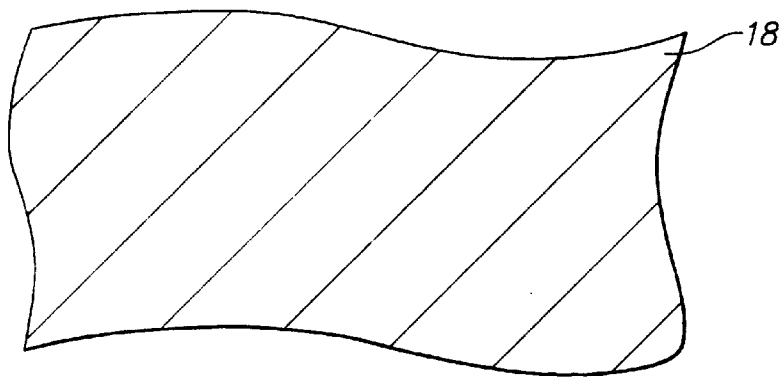

FIGS. 1B, 2B and 3B are cross-sectional, top and bottom views, respectively, of top photoresist layer 16 and bottom photoresist layer 18 formed on copper foil 10. Top photoresist layer 16 is deposited on top surface 12, and bottom photoresist layer 18 is deposited on bottom surface 14 using a dry film lamination process in which hot rolls simultaneously press photoresist layers 16 and 18 onto top and bottom surfaces 12 and 14, respectively. Photoresist layers 16 and 18 each have a thickness of 10 microns.

Figure 1C:
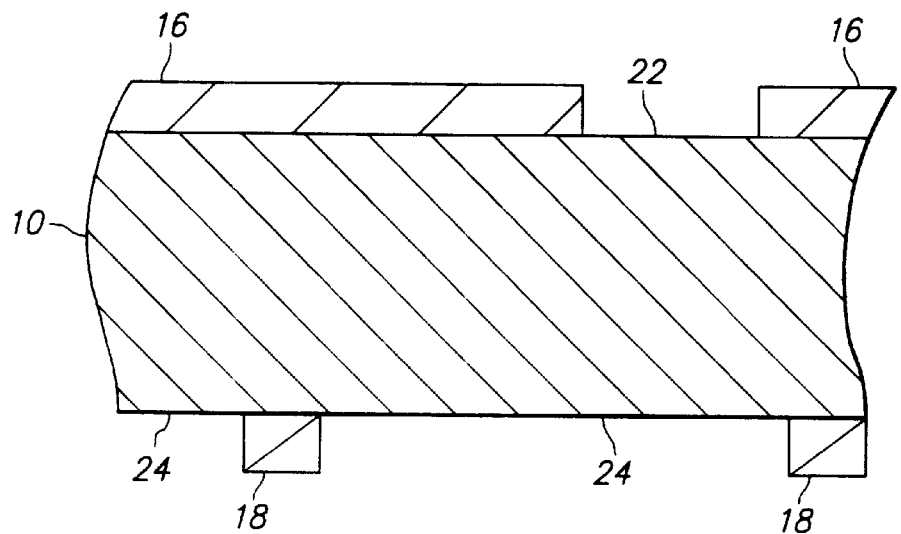
Figure 2C:
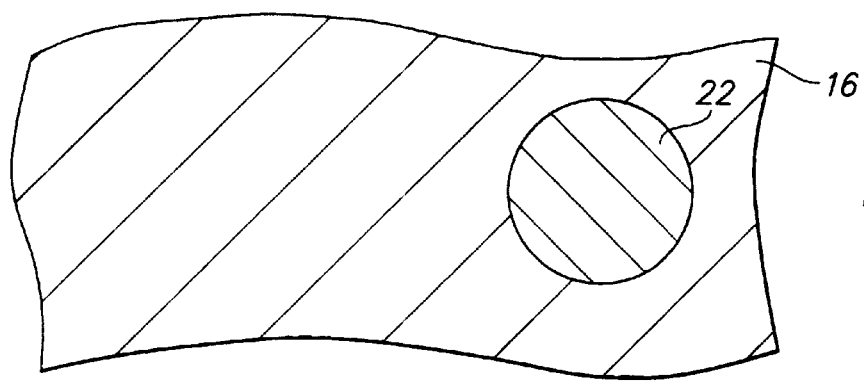
Figure 3C:
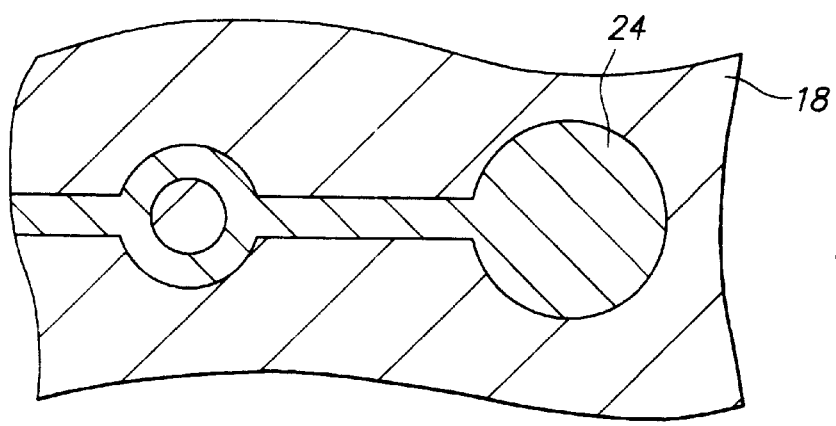

FIGS. 1C, 2C and 3C are cross-sectional, top and bottom views, respectively, of top and bottom photoresist layers 16 and 18 after they are patterned to selectively expose portions of top and bottom surfaces 12 and 14, respectively. Photoresist layers 16 and 18 are simultaneously patterned by selectively applying light through reticles (not shown), applying a developer solution to remove the photoresist portions rendered soluble by the light, and then hard baking, as is conventional. As a result, photoresist layer 16 contains an opening that selectively exposes portion 22 of top surface 12, and photoresist layer 18 contains an opening that selectively exposes portion 24 of bottom surface 14.

Figure 1D:
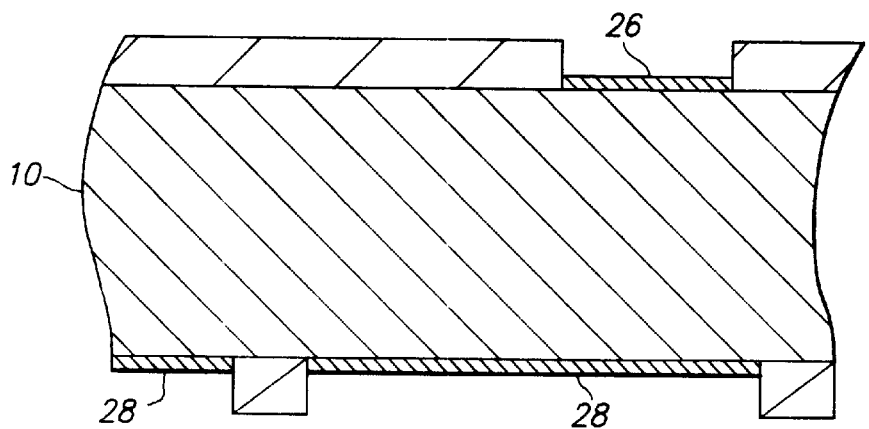
Figure 2D:
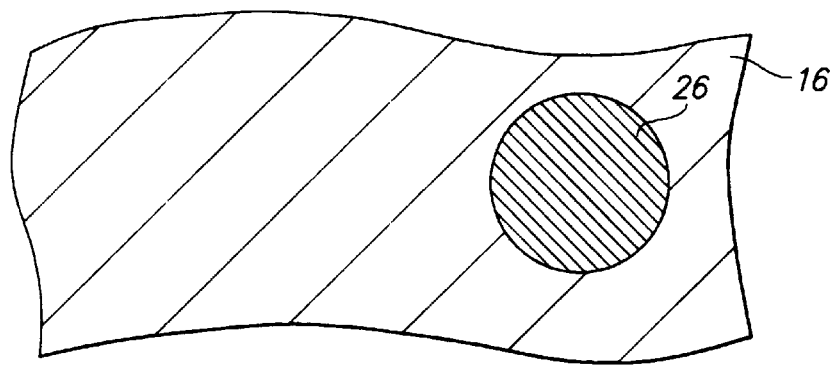
Figure 3D:
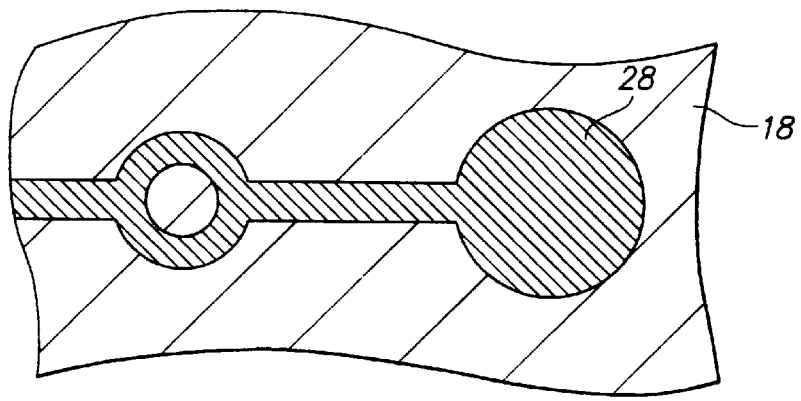

FIGS. 1D, 2D and 3D are cross-sectional, top and bottom views, respectively, of nickel etch mask 26 and nickel etch mask 28 formed on copper foil 10. Nickel etch masks 26 and 28 are simultaneously electroplated onto portions 22 and 24, respectively, of top and bottom surfaces 12 and 14, respectively. Nickel etch masks 26 and 28 each have a thickness of 0.5 microns.

Figure 1E:
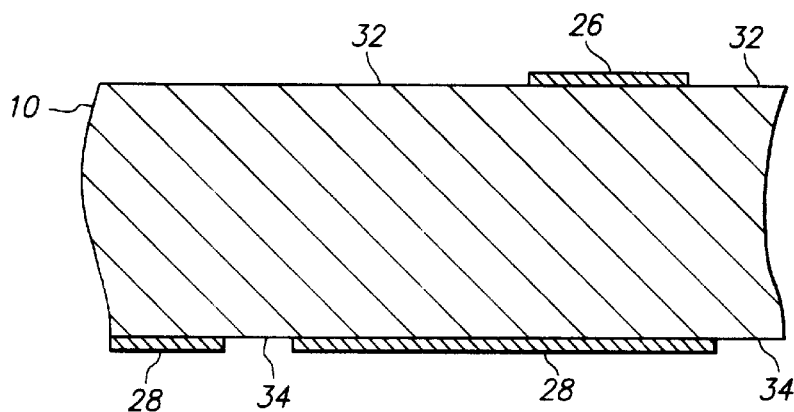
Figure 2E:
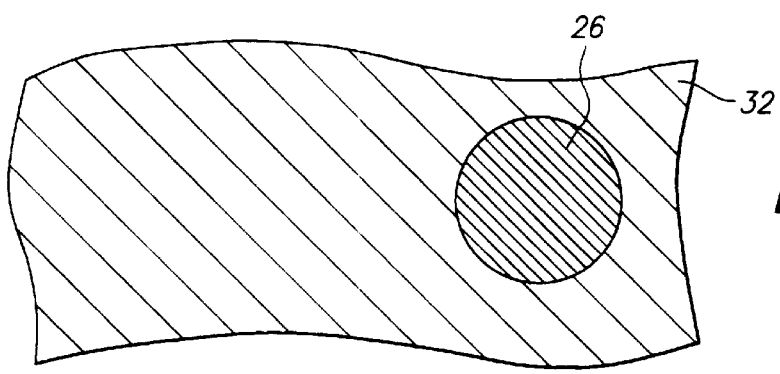
Figure 3E:
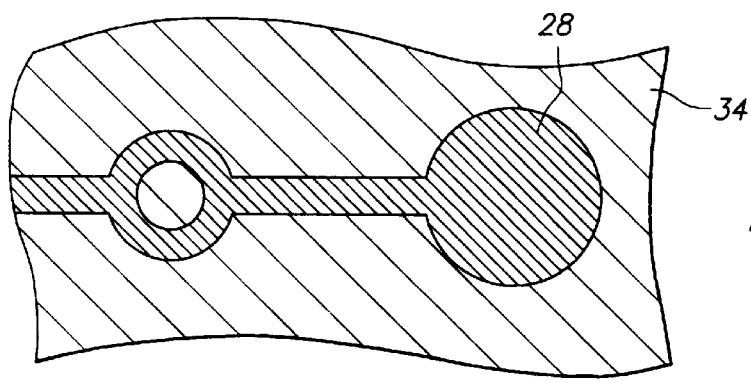

FIGS. 1E, 2E and 3E are cross-sectional, top and bottom views, respectively, of copper foil 10 and nickel etch masks 26 and 28 after photoresist layers 16 and 18 are stripped. As is seen, portions 32 and 34 of top and bottom surfaces 12 and 14, respectively, that had previously been covered by photoresist layers 16 and 18, respectively, and that are outside nickel etch masks 26 and 28, respectively, are now exposed.

Figure 1F:
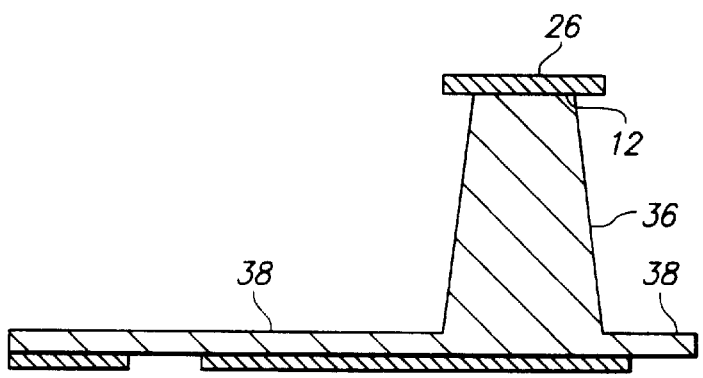
Figure 2F:
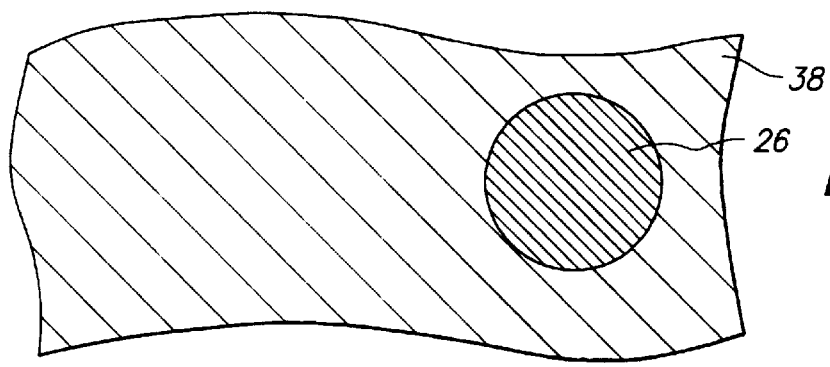
Figure 3F:
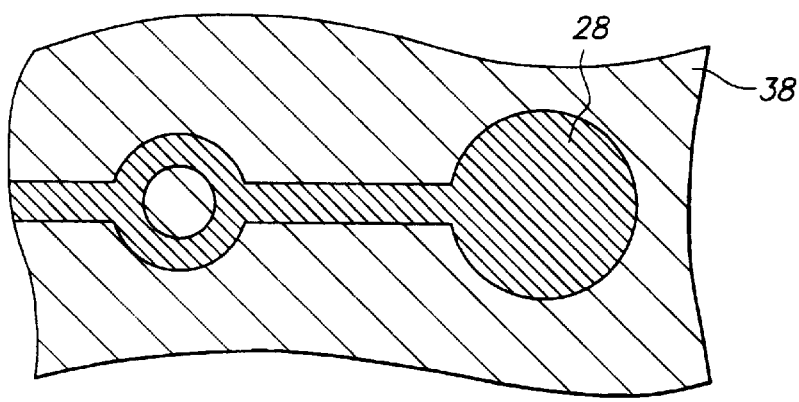

FIGS. 1F, 2F and 3F are cross-sectional, top and bottom views,, respectively, of pillar 36 formed in copper foil 10. Pillar 36 is formed by applying a "front-side" wet chemical etch to portion 32 of top surface 12 without applying the wet chemical etch to the opposite or back-side (including nickel etch mask 28 and portion 34 of bottom surface 14). For instance, the wet chemical etch can be sprayed on the front-side, or the back-side can be covered by a mask and then the structure can be dipped in the wet chemical etch. Thus, pillar 36 is formed subtractively. The wet chemical etch is highly selective of copper with respect to nickel, and therefore no appreciable amount of nickel etch mask 26 is removed. A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The wet chemical etch does not etch completely through copper foil 10. Rather, the wet chemical etch etches partially through copper foil 10. In this instance, the wet chemical etch removes an upper thickness of 125 microns from copper foil 10. Since copper foil 10 is 150 microns thick, the wet chemical etch forms recessed portion 38 in: copper foil 10 that is outside pillar 36 and is 25 microns thick. Thus, pillar 36 extends to top surface 12 whereas recessed portion 38 does not. Furthermore, since the wet chemical etch undercuts (i.e., laterally etches) copper foil 10 beneath nickel etch mask 26, pillar 36 tapers inwardly with increasing height. A suitable taper is between 45 and slightly less than 90 degrees, such as approximately 75 degrees. Pillar 36 has a diameter of 400 microns that decreases with increasing height and is narrowest at top surface 12. Furthermore, pillar 36 has a flat top surface at what remains of top surface 12. The optimal etch time for exposing portion 32 of top surface 12 to the wet chemical etch in order to form pillar 36 and recessed portion 38 with the desired dimensions can be established through trial and error.

Figure 1G:
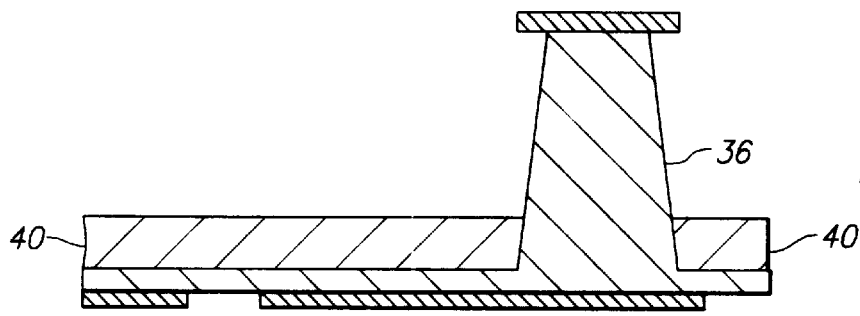
Figure 2G:
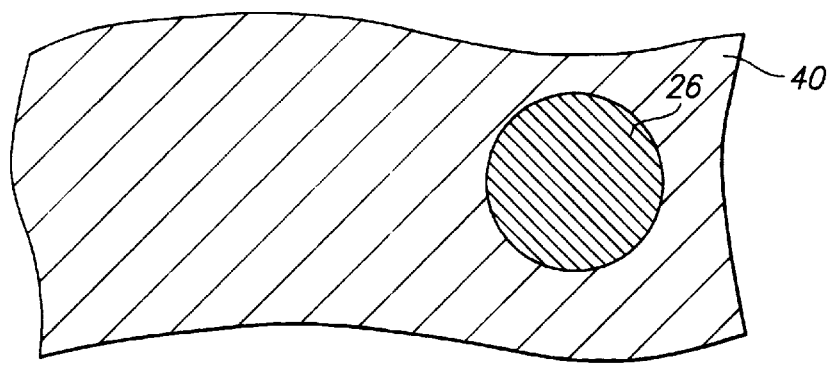
Figure 3G:
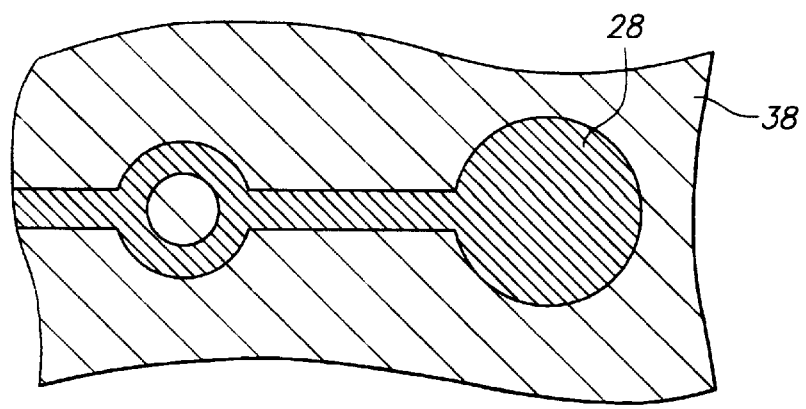

FIGS. 1G, 2G and 3G are cross-sectional, top and bottom views, respectively, of insulative base 40 formed on recessed portion 38 of copper foil 10. Insulative base 40 is relatively flat and has a thickness of 50 microns. Therefore, although insulative base 40 covers and adheres to recessed portion 38 and the lower portion of pillar 36, pillar 36 extends 75 microns above insulative base 40. Thus, insulative base 40 does not extend to top surface 12. Preferably, insulative base 40 is initially an epoxy in paste form that is selectively coated onto recessed portion 38 but not nickel etch mask 26 or top surface 12 using screen printing, and then the epoxy is cured or hardened at relatively low temperature in the range of 100–250° C. to form a solid adherent insulative layer. It is also preferred that the epoxy is a compound that includes an epoxy resin, a curing agent, an accelerator and a filler. The filler is an inert material, such as silica (powdered fused quartz), that improves thermal conductivity, thermal shock resistance, and thermal coefficient of expansion matching.

Figure 1H:
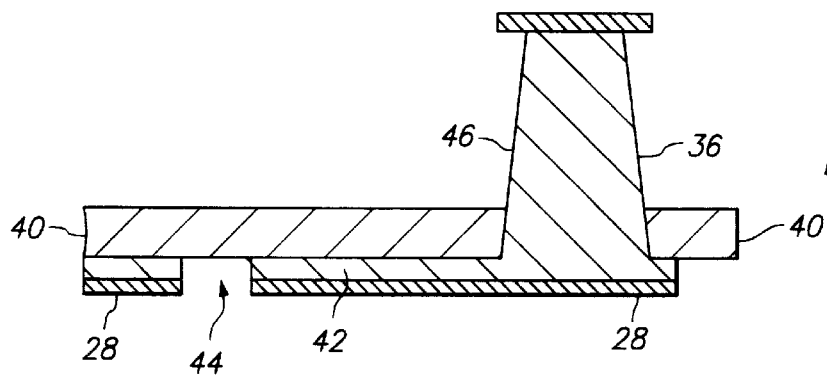
Figure 2H:
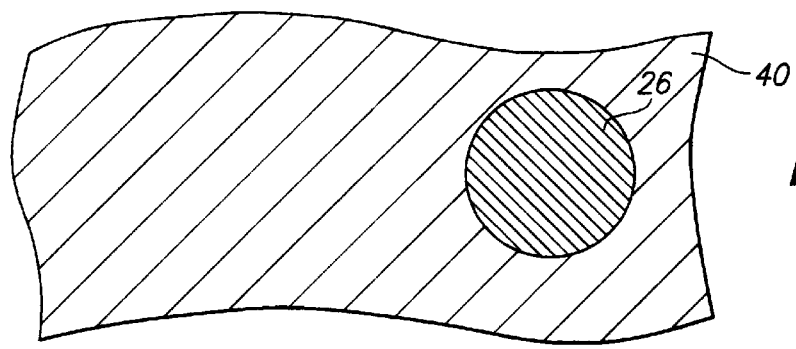
Figure 3H:
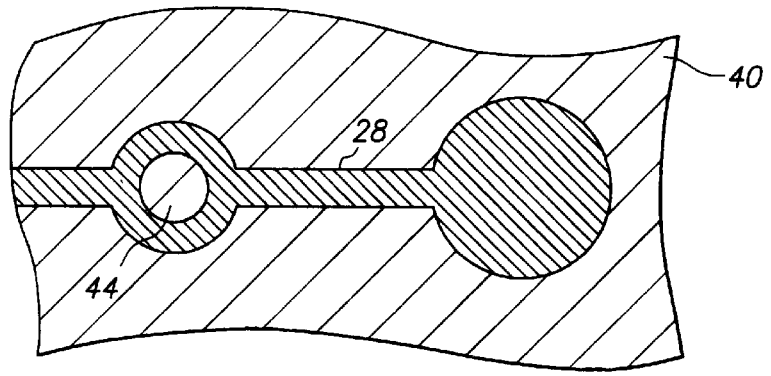
Figure 2L:
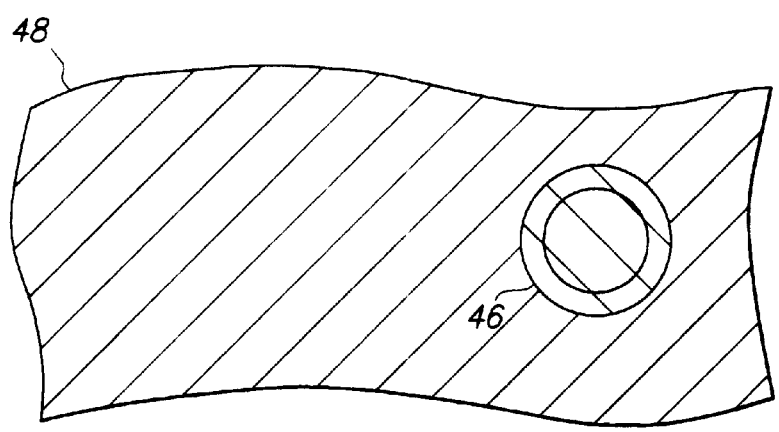
Figure 3L:
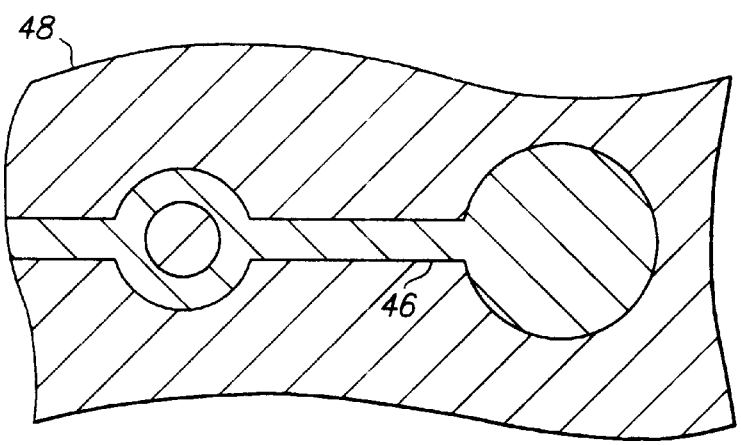

FIGS. 1H, 2H and 3H are cross-sectional, top and bottom views, respectively, of routing line 42 formed in recessed portion 38 and through-hole 44 formed in routing line 42. Routing line 42 and through-hole 44 are formed by applying a "back-side" wet chemical etch to portion 34 of bottom surface 14 without applying the wet chemical etch to the opposite or front-side (including nickel etch mask 26, pillar 36 and the top surface of insulative base 40). Thus, routing line 42 is formed subtractively. The wet chemical etch is highly selective of copper with respect to r nickel, and therefore no appreciable amount of nickel etch mask 28 is removed. Furthermore, the wet chemical etch is highly selective of copper with respect to epoxy, and therefore, after the wet chemical etch etches through portion 34 of bottom surface 14 and contacts insulative base 40, no appreciable amount of insulative base 40 is removed. A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The wet chemical etch etches completely through recessed portion 38. Thus, routing line 42 constitutes a remaining portion of recessed portion 38 after the etch is applied. Furthermore, routing line 42 includes a ring-shaped region that surrounds through-hole 44. Routing line 42 has a width of 50 microns and a thickness of 25 microns, and through-hole 44 has a diameter of 50 microns. Pillar 36 is not affected by the etch, although the etch removes regions of recessed portion 38 near the base of pillar 36. Thus, pillar 36 extends to top surface 12 whereas routing line 42 does not. In addition, pillar 36 is horizontally offset from through-hole 44, and routing line 42 provides horizontal routing (fan-in or fan-out) between pillar 36 and through-hole 44. Pillar 36 and routing line 42 in combination provide conductive trace 46 that is adapted for providing horizontal and vertical routing between a pad on a semiconductor chip (beneath bottom surface 14) and a terminal on a printed circuit board (above top surface 12) in a subsequent assembly. Advantageously, conductive trace 46 is a single continuous copper segment that is devoid of plated copper. At this stage, insulative base 40 provides critical mechanical support for conductive trace 46 which would otherwise be a dangling lead.

FIGS. 1I, 2I and 3I are cross-sectional, top and bottom views, respectively, of support circuit 48 after nickel etch masks 26 and 28 are stripped. Nickel etch masks 26 and 28 are stripped using a conventional nickel etching solution that is highly selective of nickel with respect to epoxy. In addition, since nickel etch masks 26 and 28 are extremely thin relative to conductive trace 46, and the nickel etching solution is removed immediately after nickel etch masks 26 and 28 are stripped, it is not critical that the nickel etching solution be highly selective of nickel with respect to copper. Therefore, no appreciable amount of insulative base 40 or conductive trace 46 is removed. Furthermore, portions of top and bottom surfaces 12 and 14, respectively, that had previously been covered by nickel etch masks 26 and 28, respectively, are now exposed. A suitable nickel etching solution is a dilute mixture of nitric and hydrochloric acid.

At this stage, the manufacture of support circuit 48 can be considered complete. Support circuit 48 is adapted to be mechanically and electrically coupled to a semiconductor chip to form a semiconductor chip assembly. Therefore, for illustration purposes, additional manufacturing steps related to forming a semiconductor chip assembly are described below.

Figure 1L:
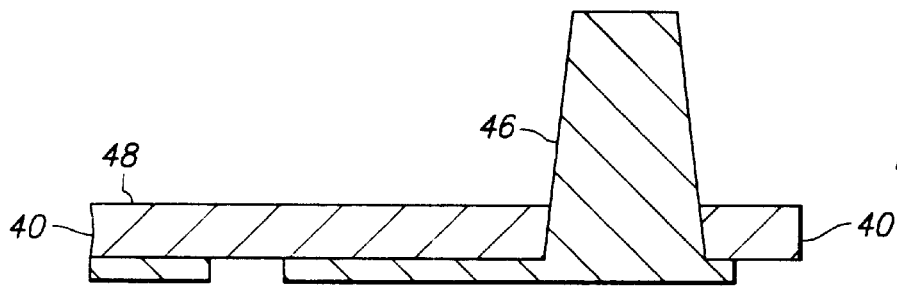
Figure 1J:
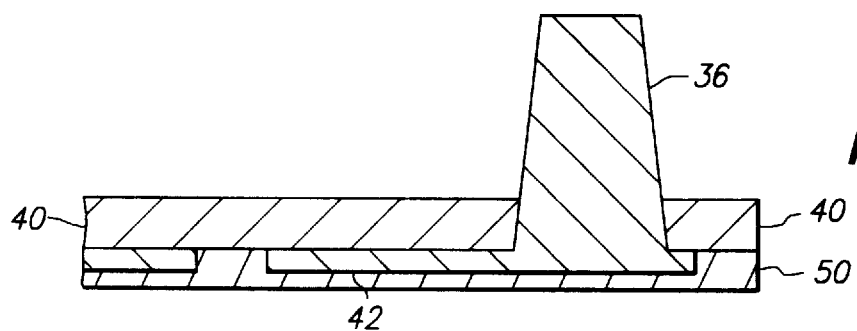
Figure 2J:
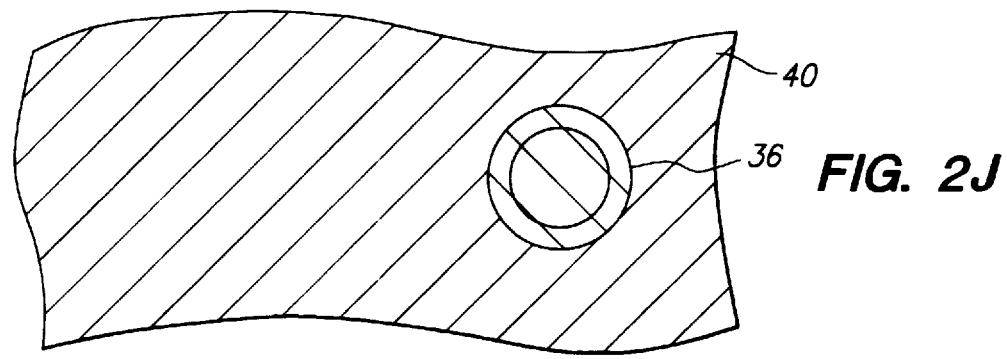
Figure 3J:
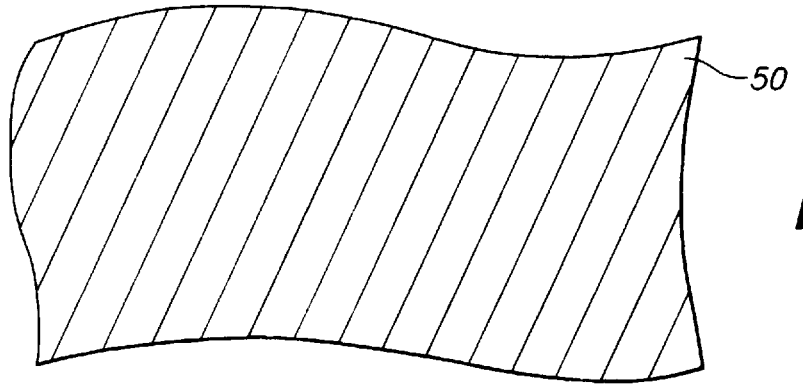

FIGS. 1J, 2J and 3J are cross-sectional, top and bottom views, respectively, of adhesive 50 on bottom surface 14 of support circuit 48. Adhesive 50 covers bottom surface 14, fills through-hole 44, and contacts and is contained by insulative base 40. Adhesive 50 is applied as an adhesive paste such as Ablestik ABELBOND 961-2™. Preferably, adhesive 50 is sandwiched between support circuit 48 and a semiconductor chip (not shown) using relatively low pressure while adhesive 50 is a paste, which causes adhesive 50 to fill most or all of through-hole 44 and the other regions outside pillar 36 and routing line 42 and beneath insulative base 40. In addition, the chip and support circuit 48 are positioned relative to one another so that a pad on the chip is aligned with through-hole 44. That is, at least a portion of the pad, and preferably a majority of the pad, is directly beneath through-hole 44. The pad and through-hole 44 can be aligned using an automated pattern recognition system. Thereafter, adhesive 50 is cured or hardened at relatively low temperature in the range of 100–300° C. to form a solid adhesive layer that is 1 to 40 microns thick and mechanically fastens the chip to support circuit 48. At this stage, through-hole 44 is covered from above by insulative base 40 and covered from below by adhesive 50.

Figure 1K:
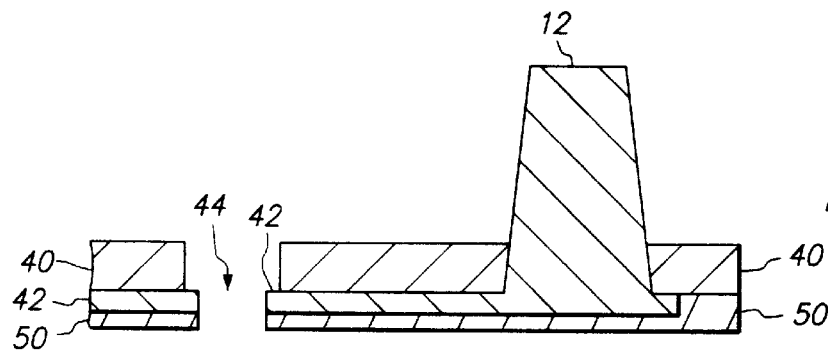
Figure 2K:
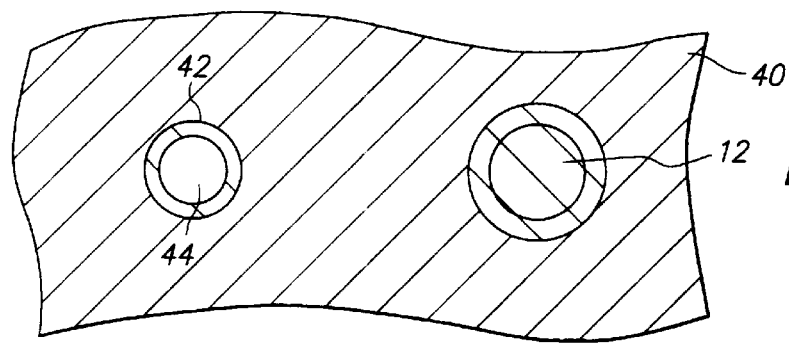
Figure 3K:
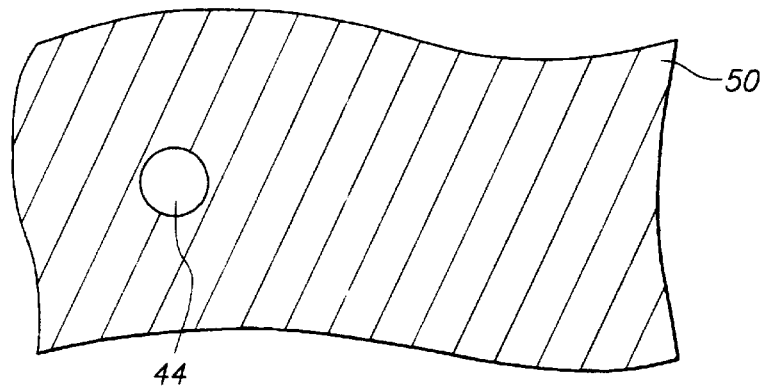

FIGS. 1K, 2K and 3K are cross-sectional, top and bottom views, respectively, of support circuit 48 after an etch is applied that forms an opening in insulative base 40 that exposes through-hole 44. In particular, a metal mask (not shown) is positioned above top surface 12 such that an opening in the metal mask is aligned with through-hole 44, and a laser is directed to the side of the metal mask opposite support circuit 48. Accordingly, the metal mask targets the laser at through-hole 44. The laser removes a portion of insulative base 40 above through-hole 44, thereby exposing through-hole 44. The laser also removes whatever adhesive 50 is inside or directly beneath through-hole 44. In addition, the laser removes a small portion of insulative base 40 outside through-hole 44 due to registration and alignment inaccuracies, thereby exposing a small portion of routing line 42 that was previously covered by insulative base 40. The laser does not deform or remove an appreciable amount of routing line 42. As a result, the laser essentially provides an extension or pattern transfer of through-hole 44 through insulative base 40 and adhesive 50. Furthermore, this exposes the underlying pad on the chip.

Thereafter, a connection joint (not shown) can be formed in through-hole 44 that contacts routing line 42 and extends through the opening in adhesive 50 to contact the underlying pad, thereby electrically connecting conductive trace 46 to the pad.

Support circuit 48 includes other conductive traces embedded in insulative base 40, and only a single conductive trace 46 is shown for convenience of illustration. The conductive traces are electrically isolated from one another by insulative base 40 except for possibly a plating bus and related circuitry that shall be subsequently disconnected or severed.

Figure 4:
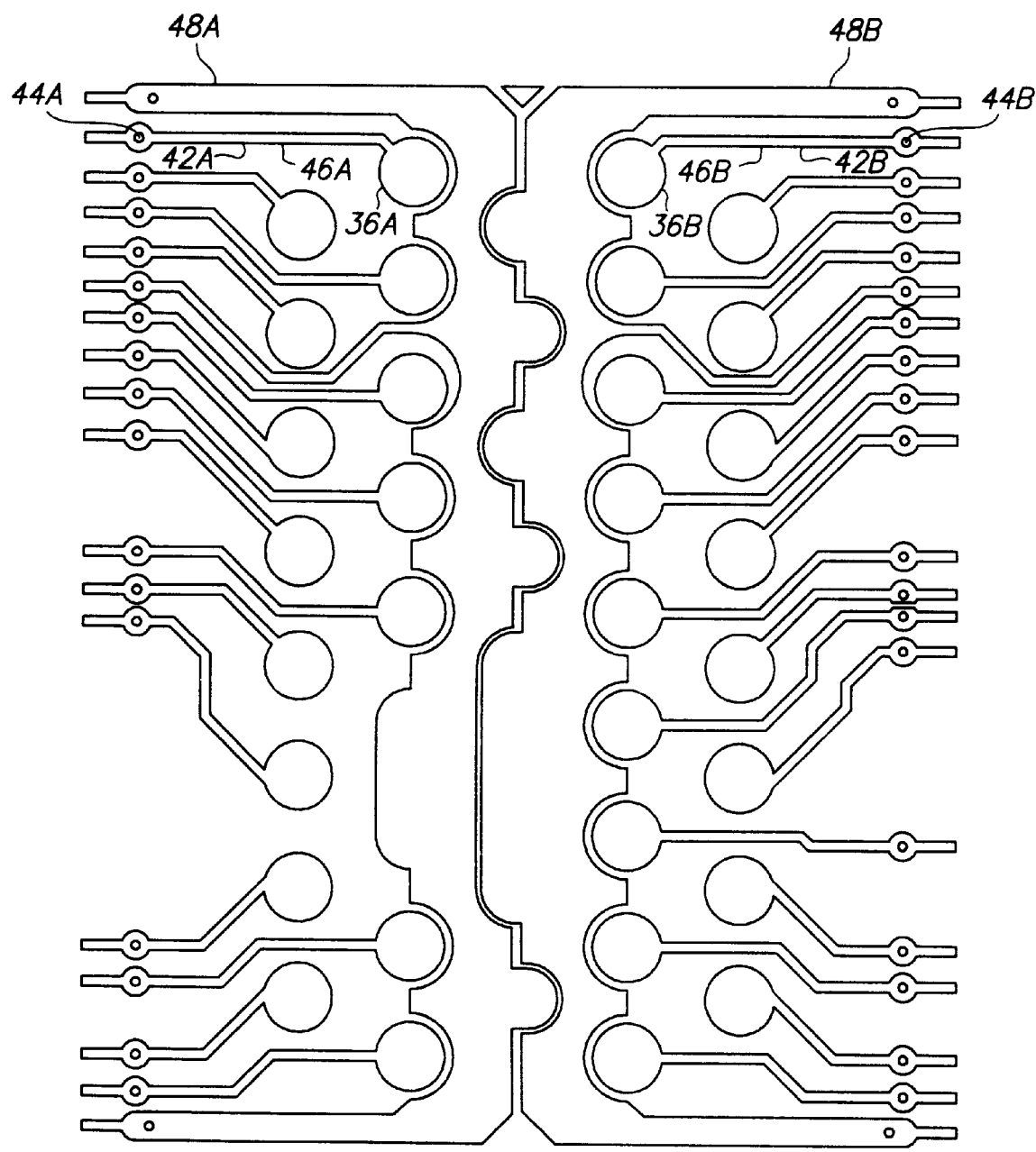
FIG. 4 is an enlarged bottom plan view of portions of adjacent support circuits in accordance with an embodiment of the present invention.

FIG. 4 is an enlarged bottom plan view of portions of adjacent support circuits 48A and 48B manufactured in accordance with the present invention. Support circuits 48A and 48B each include a plurality of conductive traces 46A and 46B, respectively. Conductive traces 46A and 46B include pillars 36A and 36B, routing lines 42A and 42B, and through holes 44A and 44B, respectively.

The support circuit described above is merely exemplary. Numerous other embodiments are contemplated.

The conductive trace can have various shapes and sizes and can be various conductive metals including copper, gold, nickel, aluminum, tin, combinations thereof, and alloys thereof. Of common metallic materials, copper has especially low resistivity and cost. Furthermore, those skilled in the art will understand that in the context of a support circuit, a copper conductive trace is typically a copper alloy that is mostly copper but not pure elemental copper, such copper-zirconium (99.9% copper), copper-silver-phosphorus-magnesium (99.7% copper), or copper-tin-iron-phosphorus (99.7% copper). The conductive trace may function as a signal, power or ground layer depending on the purpose of the associated chip pad. The conductive trace need not necessarily extend above the top surface of the insulative base, and the top portion of the conductive trace can be a ball, a pad, or a pillar (columnar post). A pillar is particularly well-suited for reducing thermal mismatch related stress in the next level assembly.

The pillar and the through-hole can have a circular, ovular, square, rectangular or other shape (as viewed from the top surface of the support circuit). Furthermore, the pillar and through-hole sidewalls may have a wide variety of shapes and slopes including vertical sidewalls, tapered sidewalls, continuous sidewalls and stepped sidewalls.

Preferably, the insulative base has a thickness of 25 to 50 microns, the routing line has a width of 10 to 100 microns and a thickness of 10 to 40 microns, the pillar has a diameter of 300 to 500 microns that decreases with increasing height, a height of 150 to 300 microns and extends 100 to 250 microns above the insulative base, and the through-hole has a diameter of 50 to 100 microns. Of course, other dimensions are suitable.

The insulative base may be rigid or flexible, and may be formed from numerous organic or inorganic insulators such as tape (polyimide), epoxy, silicone, glass (aramid) and ceramic. Organic insulators are preferred for low cost, high dielectric applications, whereas inorganic insulators are preferred when high thermal dissipation and a matched thermal coefficient of expansion are important. The insulative base can be deposited only on the recessed portion, or alternatively, deposited over the pillar and the recessed portion and then etched back so that a top portion of the pillar is exposed.

Numerous etch masks can be used to define the pillar and the routing line. For instance, the photoresist layers need not necessarily be applied or patterned simultaneously. For feature sizes of 25 microns or less, a spin coated liquid photoresist may be preferable to a dry film photoresist since the liquid photoresist can be thinner. Furthermore, if the photoresist can withstand the temperature at which the insulative base is cured (or the insulative base need not be cured) then metal etch masks may not be necessary. In this instance, photoresist layers 16 and 18 can provide the etch masks that define portions 32 and 34, respectively, of top and bottom surfaces 12 and 14, respectively, thereby avoiding the need for nickel etch masks 26 and 28. Moreover, if thin conductive metal etch masks such as nickel or gold are used, it may not be necessary to strip the etch masks after forming the pillar and routing line. In fact, it may be desirable to leave nickel etch masks on a copper conductive trace in order to protect the underlying copper from corrosion. Suitable metal etch masks include nickel, gold, tin, tin-nickel and tin-lead (solder).

Numerous adhesives can be applied to the bottom surface of the support circuit after the conductive trace is formed. For instance, the adhesive can be applied as a paste, a laminated layer, or a liquid applied by screen-printing, spin-on, or spray-on. If a laminated adhesive is applied, little or no adhesive will enter the through-hole.

Numerous etches can be applied to form the pillar, routing line and through-hole as well as the opening in the insulative base that exposes the through-hole and the opening in the adhesive directly below the through-hole.

The opening in the insulative base that exposes the through-hole may be formed either before or after mechanically attaching the support circuit to a chip. Likewise, the opening in the adhesive beneath the through-hole may be formed either before or after mechanically attaching the support circuit to a chip. For instance, the adhesive can be applied as a paste (A stage) to the bottom surface of the support circuit, the adhesive can be partially cured (B stage), an etch can form the openings in the insulative base and the adhesive, the partially cured adhesive can be brought into contact with the chip, thereby exposing the pad through the openings and the through-hole, and then the adhesive can be fully cured (C stage).

After the pillar is formed, a soldering material or solder ball can be deposited over the pillar by plating or printing or placement techniques if required for the next level assembly. However, the next level assembly may not require that the support circuit contain solder. For instance, in land grid array (LGA) packages, the soldering material is normally provided by the panel rather than the top surface of the support circuit.

The routing line need not include a through-hole. For instance, routing line 42 can have a uniform width and not contain through-hole 44 or the ring-shaped region that surrounds through-hole 44. Thereafter, a chip and support circuit 48 can be positioned relative to one another so that routing line 42 is aligned with. and overlaps a pad on the chip, and an etch can be applied that forms openings in insulative base 40 and adhesive 50 whereby the opening in insulative base 40 exposes routing line 42 and the openings in insulative base 40 and adhesive 50 expose the pad.

The "top" and "bottom" surfaces of the support circuit do not depend on the orientation of the assembly, as will be readily apparent to those skilled in the art. For instance, an upper surface of a chip that includes a pad faces the bottom surface of the support circuit, and the top surface of the support circuit faces away from the chip, regardless of whether the assembly is inverted and/or mounted on a printed circuit board. Similarly, the pillar extends "above" the routing line regardless of whether the support circuit is inverted. Likewise, the support circuit is shown with the pillar above the routing line with a single orientation throughout the drawings for ease of comparison between the figures, although the support circuit may be inverted at various manufacturing stages.

The working format for the support circuit can be a single chip, a wafer, a strip or a panel based on the manufacturing design. For instance, when the working format is a wafer, numerous support circuits are simultaneously batch manufactured on a single wafer and then separated from one another during singulation. As another example, when the working format is a strip (or reel-to-reel) form, numerous support circuits are manufactured on a strip before the chips are individually attached to support circuits. Semiconductor chip assemblies manufactured using a strip can be chip scale packages, chip size packages, ball grid arrays, or other structures. The wafer-based approach employs fewer steps and is less time consuming than the strip-based approach, however the strip-based approach is easier to control and has better dimensional stability than the wafer-based approach since aligning the routing lines with the pads involves a single chip and a single support circuit rather than the entire wafer and numerous support circuits.

Advantageously, the support circuit of the present invention is reliable and inexpensive. The insulative base protects the conductive trace from handling damage, provides a known dielectric barrier for the conductive trace, and prevents solder reflow at the top surface of the support circuit from contacting or electrically shorting the underlying routing line. The tapered pillar yields enhanced reliability for the next level assembly that exceeds that of conventional BGA packages. Furthermore, the support circuit can provide mechanical and metallurgical coupling with a chip without wire bonding, TAB, flip-chip bonding, polishing, or solder joints. As a result, the support circuit of the present invention significantly enhances throughput, yield and performance characteristics compared to conventional packaging techniques. Moreover, the support circuit of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of manufacturing a support circuit, comprising:

providing a conductive layer with top and bottom surfaces;

providing a top etch mask on the top surface that includes an opening; that exposes a portion of the top surface;

providing a bottom etch mask on the bottom surface that includes an opening that exposes a portion of the bottom surface;

applying an etch to the exposed portion of the top surface through the opening in the top etch mask, thereby etching partially but not completely through the conductive layer and forming a recessed portion in the conductive layer below the top surface;

forming an insulative base on the recessed portion; and applying an etch to the exposed portion of the bottom surface through the opening in the bottom etch mask, thereby forming a routing line in the recessed portion that extends to and is covered by the insulative base.

2. The method of claim 1, including providing the top and bottom etch masks simultaneously.

3. The method of claim 1, including providing the top and bottom etch masks during a single electroplating operation.

4. The method of claim 1, wherein the insulative base covers the routing line without extending to the bottom surface.

5. The method of claim 1, wherein applying the etch to the exposed portion of the top surface forms a pillar in the conductive layer, and forming the insulative base allows the pillar to extend above the insulative base.

6. The method of claim 5, wherein the pillar has a diameter that is narrowest at the top surface.

7. The method of claim 5, wherein the routing line provides horizontal routing for the pillar.

8. The method of claim 1, including simultaneously removing the top and bottom etch masks after forming the routing line.

9. The method of claim 1, including depositing an adhesive on the routing line that contacts and is contained by the insulative base.

10. The method of claim 1, wherein the conductive layer is a copper foil.

11. A method of manufacturing a support circuit, comprising the following steps in the sequence set forth:

providing a conductive metal layer with top and bottom surfaces;

providing a top etch mask on the top surface and a bottom etch mask on the bottom surface, wherein the top etch mask includes an opening that exposes a portion of the top surface, and the bottom etch mask includes an opening that exposes a portion of the bottom surface;

applying an etch to the exposed portion of the top surface through the opening in the top etch mask, thereby etching partially but not completely through the conductive metal layer and forming a recessed portion in the conductive metal layer below the top surface;

forming an insulative base on the recessed portion; and applying an etch to the exposed portion of the bottom surface through the opening in the bottom etch mask, thereby forming a routing line in the recessed portion that extends to and is covered by the insulative base.

12. The method of claim 11, including providing the top and bottom etch masks simultaneously, and then removing the top and bottom etch masks simultaneously after forming the routing line.

13. The method of claim 11, wherein providing the top and bottom etch masks includes:

providing a top photoresist layer on the top surface and a bottom photoresist layer on the bottom surface;

simultaneously electroplating the top etch mask on a region of the top surface defined by the top photoresist layer and the bottom etch mask on a region of the bottom surface defined by the bottom photoresist layer; and stripping the top-and-bottom-photoresist layers.

14. The method of claim 11, including depositing an adhesive on the routing line from the bottom surface such that the adhesive contacts and is contained by the insulative base.

15. The method of claim 14, wherein the adhesive covers the bottom surface.

16. The method of claim 11, wherein applying the etch to the exposed portion of the top surface forms a pillar in the conductive metal layer, and the routing line provides horizontal routing for the pillar.

17. The method of claim 16, wherein the pillar is tapered and has a diameter that decreases as a height of the pillar increases and is narrowest at the top surface.

18. The method of claim 16, wherein the pillar extends a first distance above the routing line, the insulative base extends a second distance above the routing line, and the first distance is at least twice the second distance.

19. The method of claim 11, wherein the conductive metal layer is a copper foil and the top and bottom etch masks are nickel.

20. The method of claim 11, wherein the insulative base is epoxy.

21. A method of manufacturing a support circuit, comprising the following steps in the sequence set forth:

providing a conductive metal layer with top and bottom surfaces;

providing a top etch mask on the top surface and a bottom etch mask on the bottom surface, wherein the top etch mask includes an opening that exposes a portion of the top surface, and the bottom etch mask includes an opening that exposes a portion of the bottom surface;

applying an etch to the exposed portion of the top surface through the opening in the top etch mask, thereby etching partially but not completely through the conductive metal layer, so as to form a pillar in the conductive metal layer that tapers and has a narrowest diameter at the top surface and a recessed portion in the conductive metal layer below the top surface;

forming an insulative base on the recessed portion such that the pillar extends into the insulative base and the insulative base covers the recessed portion; and applying an etch to the exposed portion of the bottom surface through the opening in the bottom etch mask, thereby etching completely through the recessed portion, so as to form a routing line in the recessed portion that extends to the bottom surface and is covered by the insulative base, wherein the routing line provides horizontal routing for the pillar.

22. The method of claim 21, wherein providing the top and bottom etch masks includes:

providing a top photoresist layer on the top surface and a bottom photoresist layer on the bottom surface;

simultaneously electroplating the top etch mask on a region of the top surface defined by the top photoresist layer and the bottom etch mask on a region of the bottom surface defined by the bottom photoresist layer; and stripping the top and bottom photoresist layers.

23. The method of claim 21, including simultaneously stripping the etch masks after applying the etches.

24. The method of claim 21, including covering the bottom surface with an adhesive that contacts and is contained by the insulative base.

25. The method of claim 21, wherein the pillar extends a first distance above the routing line, the insulative base extends a second distance above the routing line, and the first distance is at least twice the second distance.

26. The method of claim 21, wherein the insulative base is an insulator selected from the group consisting of tape, epoxy, silicone, glass and ceramic.

27. The method of claim 21, wherein the conductive metal layer is copper, the top and bottom etch masks are nickel, and the insulative base is epoxy.

28. The method of claim 21, wherein the method excludes polishing.

29. The method of claim 21, wherein the support circuit is devoid of wire bonds, TAB leads, and solder joints.

30. The method of claim 21, wherein the support circuit is adapted for a semiconductor chip assembly.

31. A method of manufacturing a support circuit, comprising the following steps in the sequence set forth:

providing a copper layer with top and bottom surfaces;

providing a top etch mask on the top surface and a bottom etch mask on the bottom surface, wherein the top etch mask includes an opening that exposes a portion of the top surface, and the bottom etch mask includes an opening that exposes a portion of the bottom surface;

applying a wet chemical etch to the exposed portion of the top surface through the opening in the top etch mask, thereby etching partially but not completely through the copper layer, so as to form a pillar in the copper layer that extends to the top surface and a recessed portion in the copper layer below the top surface;

forming an insulative base on the recessed portion such that the pillar extends into the insulative base and the insulative base covers the recessed portion; and applying an etch to the exposed portion of the bottom surface through the opening in the bottom etch mask, thereby etching completely through the recessed portion, so as to form a routing line in the recessed portion that extends to the bottom surface and is covered by the insulative base, wherein the pillar extends a first distance above the routing line, the insulative base extends a second distance above the routing line, the first distance is at least twice the second distance, and the routing line provides horizontal routing for the pillar.

32. The method of claim 31, including applying an etch to the insulative base through an etch mask over the top surface after forming the routing line to form an opening in the insulative base.

33. The method of claim 32, wherein the opening exposes the routing line.

34. The method of claim 31, including providing an adhesive that covers the routing line and contacts the insulative base.

35. The method of claim 34, including applying an etch to the insulative base and the adhesive through an etch mask over the top surface to form an opening in the insulative base and an opening in the adhesive.

36. The method of claim 35, wherein the opening in the insulative base exposes the routing line, and the openings in the insulative base and the adhesive in combination extend through the support circuit.

37. The method of claim 31, wherein the pillar has a diameter that is narrowest at the top surface and a taper that extends from the top surface to the routing line.

38. The method of claim 31, wherein the method excludes polishing.

39. The method of claim 31, wherein the support circuit is devoid of wire bonds, TAB leads, and solder joints.

40. The method of claim 31, wherein the support circuit is adapted for a semiconductor chip assembly.

41. A method of manufacturing a support circuit, comprising:

providing a conductive layer with top and bottom surfaces;

providing a top etch mask on the top surface that includes an opening that exposes a portion of the top surface;

providing a bottom etch mask on the bottom surface that includes an opening that exposes a portion of the bottom surface;

applying an etch to the exposed portion of the top surface through the opening in the top etch mask, thereby etching partially but not completely through the conductive layer and forming a pillar in the conductive layer that extends to the top surface and a recessed-portion in the conductive layer below the top surface;

forming an insulative base on the recessed portion; and then applying an etch to the exposed portion of the bottom surface through the opening in the bottom etch mask, thereby forming a routing line in the recessed portion that extends to and is covered by the insulative base.

42. The method of claim 41, wherein the conductive layer is a single continuous piece of metal.

43. The method of claim 41, wherein the recessed portion is formed by a single wet chemical etch step.

44. The method of claim 41, wherein the recessed portion has a depth that is less than one-half a distance between the top and bottom surfaces.

45. The method of claim 41, wherein the pillar has a diameter that is narrowest at the top surface and a continuous taper that extends from the top surface to the routing line.

46. The method of claim 41, including applying an etch to the insulative base after forming the routing line to form an opening in the insulative base that exposes the routing line.

47. The method of claim 41, including removing the top etch mask after forming the insulative base.

48. The method of claim 41, including simultaneously removing the top and bottom etch masks after forming the routing line.

49. The method of claim 41, wherein the support circuit is devoid of wire bonds, TAB leads and solder joints.

50. The method of claim 41, wherein the support circuit is adapted to be mechanically and electrically coupled to a semiconductor chip such that the support circuit and the chip in combination form a semiconductor chip assembly.

* * * * *